(12) United States Patent
Inoue et al.

(10) Patent No.: US 8,314,343 B2
(45) Date of Patent: Nov. 20, 2012

(54) MULTI-LAYER BOARD INCORPORATING ELECTRONIC COMPONENT AND METHOD FOR PRODUCING THE SAME

(75) Inventors: Yusuke Inoue, Takasaki (JP); Eiji Mugiya, Takasaki (JP); Masashi Miyazaki, Takasaki (JP); Tatsuro Sawatari, Takasaki (JP); Yuichi Sugiyama, Takasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 780 days.

(21) Appl. No.: 12/200,920

(22) Filed: Aug. 28, 2008

(65) Prior Publication Data

US 2009/0084596 A1  Apr. 2, 2009

(30) Foreign Application Priority Data

Sep. 5, 2007  (JP) .................................. 2007-229920
Aug. 22, 2008 (JP) .................................. 2008-214021

(51) Int. Cl.
*H05K 1/18* (2006.01)
*H05K 3/30* (2006.01)

(52) U.S. Cl. ........ 174/260; 174/255; 174/258; 174/259; 29/829; 29/830; 29/832; 29/846; 361/761

(58) Field of Classification Search .................. 174/250, 174/255, 256, 258, 260, 261; 29/825, 829, 29/831–832, 841, 846; 361/748, 750, 760–764
See application file for complete search history.

(56) References Cited

U.S. PATENT DOCUMENTS

| | | | |
|---|---|---|---|
| 6,928,726 B2 * | 8/2005 | Zollo et al. ....................... 29/832 |
| 7,348,662 B2 * | 3/2008 | Miyazaki et al. ............. 257/679 |
| 7,379,306 B2 * | 5/2008 | Sawatari et al. .............. 361/761 |
| 7,583,512 B2 * | 9/2009 | Ryu et al. ....................... 361/765 |
| 7,738,256 B2 * | 6/2010 | Sawatari et al. ............... 361/761 |
| 7,886,433 B2 * | 2/2011 | Bae et al. ........................ 29/846 |
| 2008/0196931 A1 * | 8/2008 | Lee et al. ....................... 174/260 |
| 2009/0244865 A1 * | 10/2009 | Tanaka .......................... 361/764 |
| 2010/0288535 A1 * | 11/2010 | Hong et al. .................... 174/252 |
| 2011/0203836 A1 * | 8/2011 | Yokota et al. ................. 174/250 |

FOREIGN PATENT DOCUMENTS

| | | | |
|---|---|---|---|
| JP | 2000243873 A | * | 9/2000 |
| JP | 2000261124 A | * | 9/2000 |
| JP | 2003-031954 A1 | | 1/2003 |
| JP | 2005072627 A | * | 3/2005 |
| JP | 2005-1991156 A | | 7/2005 |
| JP | 2005-311249 A1 | | 11/2008 |

\* cited by examiner

*Primary Examiner* — Robert J Hoffberg

(74) *Attorney, Agent, or Firm* — Law Office of Katsuhiro Arai

(57) ABSTRACT

In a multi-layer substrate including a core formed with a plurality of holes capable of containing an electronic part, a bottom insulating resin layer formed on a bottom surface of the core, a top insulating resin layer formed on a top surface of the core, a wiring layer selectively formed on an outer layer of the bottom insulating resin layer or top insulating resin layer, and an electronic part contained in the holes, both of the bottom and top insulating resin layers have a structure that is a combination of a resin which is changed to cohesiveness when heated and which undergoes smaller plastic deformation when heated to a higher temperature and an insulating resin layer which has a thickness sufficient to maintain insulation between the electronic part or a conductor of the core and the wiring layer and which inherently undergoes small plastic deformation, so that the electronic part can be securely and sealed in the holes without using a particular adhesive.

8 Claims, 8 Drawing Sheets

(a)

(b)

MULTI-LAYER BOARD INCORPORATING ELECTRONIC COMPONENT AND METHOD FOR PRODUCING THE SAME

BACKGROUND OF THE INVENTION

1. Field of the Invention

The present invention relates to an electronic part-incorporated multilayer substrate and a method of producing the same. More particularly, the invention relates to an electronic part-incorporated multilayer substrate having a structure in which a core made of a metal or an organic material and formed with an electronic part accommodation part is sealed with an insulating resin layer. The invention also relates to a method of producing such a multi-layer substrate.

2. Description of the Related Art

As a result of the diversification of portable equipment, an electronic part-incorporated multilayer substrate having a structure as described above have come into use as functional modules, semiconductor packages, and mother boards for various applications including cellular phone, portable electronic dictionaries, personal information instruments (sometime abbreviated as PDAs), and digital cameras (sometimes abbreviated as DSCs). Specifically, applications of such multi-layer substrates include:

1) parts-incorporated module substrate, e.g., radio modules, power supply modules, camera modules 2) parts-incorporated semiconductor package substrate, e.g., capacitor-incorporated substrate for decoupling 3) small and thin mother boards with built-in parts Such electronic part-incorporated multilayer substrate may be fabricated using various methods depending on the scale of electronic circuits to be incorporated therein. In particular, a substrate of this type may be designed using a build-up industrial method to provide the substrate with required layers. The substrate may be designed by categorizing chip-type passive parts such as capacitors, resistors, and inductors and active parts such as semiconductor modules into parts to be incorporated and parts to be externally mounted. Various methods and configurations are used to package electronic part-incorporated multilayer substrate with high density and high accuracy. Recently, there are demands for electronic part-incorporated multilayer substrate having smaller thicknesses.

Known techniques for satisfying such demands in the related art include, for example, the techniques disclosed in Patent Documents 1 and 2 listed below.

Patent Document 1 discloses an electronic part-incorporated multilayer substrate, which has a structure similar to that of a multi-layer substrate according to the related art. The multi-layer substrate includes a conductor pattern formed on an insulating substrate to serve as a core. Active parts are mounted on the conductor pattern. A dam formation material is applied to a height in accordance with the height of the active parts mounted as described above. A cavity for accommodating electronic parts is defined by the dam formation material. The cavity is filled with an insulating resin such that electronic parts are surrounded by the resin. The document discloses a structure and a production method for building up further layers accommodating electronic parts in the same way as occasion demands.

There are demands for more significant reductions in the thickness of multi-layer substrates than that achievable with the structure formed by a multi-layer substrate carrying electronic parts and a dam formation material proposed in Patent Document 1. Under the circumstance, proposals have been made to introduce multi-layer substrates in which an insulating substrate serving as a core as proposed in Patent Document 1 is replaced with a thin resin layer and in which a substrate formed with through holes for accommodating electronic parts is used as a core. Such a multi-layer substrate is disclosed in Patent Document 2 and will be described in detail below.

A multi-layer substrate according to Patent Document 2 has a core having through holes, and a sheet having an insulating resin layer formed thereon is applied to one side of the core. Thus, the through holes are closed at one side thereof, and holes to serve cavities are formed. Electronic parts are disposed in the holes and are secured on the insulating resin layer using an adhesive. The holes are filled with an insulating resin such that the electronic parts are surrounded by the resin. A wiring layer having a wiring pattern is formed on an outer surface of the insulating resin layer.

FIG. 7 and FIG. 8 are illustrations showing some of steps of producing an electronic part-incorporated multilayer substrate according to Patent Document 2. First, as shown in FIG. 7A, a half callousness resin sheet 103, which may be referred to as "B-stage resin", laminated with copper foil 102 is bonded to one side of a metal core 101 formed with a part accommodation part 100 in the form of a through hole. The resin sheet 103 is made of a material having insulating properties, and an insulating resin layer is therefore formed by the resin sheet 103.

Next, as shown in FIG. 7B, an appropriate amount of liquid adhesive 104 is supplied to the part accommodation part 100 by a dispenser. Thereafter, an electronic part 105 such as an active part or a passive part is placed in the part accommodation part 100 as shown in FIG. 7C, and the liquid adhesive 104 is then cured to secure the electronic part 105. Next, as shown in FIG. 8A, a half callousness resin sheet 107 laminated with copper foil 106 is disposed to cover the electronic part 105 in the part accommodation part 100 and the cured liquid adhesive 104. The resin sheet 107 is heated to fill in the part accommodation part 100 with the resin as shown in FIG. 8B. An insulating resin layer is formed by the resin sheet 107. A filler made of an inorganic material having insulating properties is included in the resin sheet 107 such that the linear expansion coefficient of the sheet is kept small enough to prevent thermal stress attributable to thermal expansion from being exerted on the electronic part.

Patent Document 1: JP-A-2003-031954
Patent Document 2: JP-A-2005-311249

The above-described technique in the related art has the following problems.

First, the insulating resin layer 103 and the insulating resin layer 107 must have predetermined thicknesses to keep the metal core 101 and the electronic part 105 insulated from the wiring layer that is formed later. Since the resin sheet 103 and the resin sheet 107 to serve as insulating resin layers are half callousness, there is a problem in that the thicknesses of the layers can vary because of deformation of the same. It is therefore difficult to obtain layer thicknesses which are sufficient to maintain desired insulating properties. Further, there is a difficulty in reducing the thickness of the substrate having the layers.

Second, the resin sheet 107 includes a filler for keeping the linear expansion coefficient of the sheet small enough. When the amount of the filler is great, a problem arises in that there is no room for increasing the amount of the filler to prevent any reduction in adhesive power between the resin layer 107 and a wiring conductor which is formed on the resin layer 107 after the copper foil 106 is removed.

Third, since the electronic part 105 is secured by supplying the liquid adhesive 104 in a required amount to the part storage part 100, the height of the electronic part 105 can vary depending on the amount of the liquid adhesive 104 supplied. For example, when the amount supplied is too great, the electronic part 105 is raised by the liquid adhesive 104 supplied in an excessive amount. A difficulty in adjustment therefore arises because the height of the electronic part 105 is increased accordingly, and management must be carried out with higher accuracy, which can result in a cost increase.

Fourth, the work of supplying an appropriate amount of the liquid adhesive 104 to a number of the part storage parts 100 by means of a dispenser or the like necessitates supplying under one-by-one control regardless of work by human or machine, which becomes a factor causing an increase in cost.

SUMMARY OF THE INVENTION

According to an embodiment of the invention, it is an object to provide an electronic part-incorporated multilayer substrate and a method of producing the same, in which variation of the thickness of an insulating resin layer can be reduced to maintain insulating properties; the linear expansion coefficient of the insulating resin layer can be reduced in a part thereof that fills a part accommodation part; and, sufficient adhesion with the wiring conductor formed on the insulating resin layer can be maintained.

There is also provided an electronic part-incorporated multilayer substrate and a method of producing the same, in which an operation of supplying an adhesive to each part accommodation part can be omitted. It is therefore possible to suppress variation of the mounting height of an electronic part contained in a part accommodation part which can be caused by variation in the amount of an adhesive supplied to the part.

In a first aspect of the invention, there is provided an electronic part-incorporated multilayer substrate, including a core formed from a metal or an organic material and formed with a plurality of holes capable of containing an electronic part, a bottom insulating resin layer formed on a bottom surface of the core, a top insulating resin layer formed on a top surface of the core, a wiring layer selectively formed in a predetermined (desired) position of an outer surface of the bottom insulating resin layer or top insulating resin layer (the term "selectively" used in this aspect and other aspects of the invention described below means that the wiring layer is selectively formed in the predetermined or desired position), and an electronic part contained in any of the holes. The bottom insulating resin layer is formed by a first insulating resin layer and a second insulating resin layer. The second insulating resin layer is a resin which is changed to have cohesiveness when heated and which enters a state having small plastic deformation when further heated to a higher temperature. The second insulating resin layer is bonded to the bottom surface of the core, and the first insulating resin layer undergoing small plastic deformation is formed on a bottom surface of the second insulating resin layer, the first insulating resin layer having a thickness sufficient to maintain insulation between the electronic part or a conductor of the core and the selectively disposed wiring layer (in the this aspect and other aspects of the invention described below, the term "undergoing small plastic deformation" means that the amount of plastic deformation of a molded layer is ±25% or less of the initial thickness of the material). At least a part of the bottom surface of the electronic part is bonded and secured to the second insulating resin layer in the hole.

In the first aspect of the invention, a structure is used in which an insulating resin layer has two parts, i.e., an insulating resin layer which is first in an adhesive property to be used for bonding and which is solidified into a part having small plastic deformation and another insulating resin layer having no flowability and small plastic deformation for maintaining an insulation resistance. Thus, contradictory requirements at production steps can be satisfied. Since variation of the thickness of a bottom insulating resin layer can be suppressed, a bottom insulation resin layer can be provided with a small thickness that is preferable from the point of view of designing.

In a second aspect of the invention, there is provided an electronic part-incorporated multilayer substrate, including a core formed from a metal or an organic material and formed with a plurality of holes capable of containing an electronic part, a bottom insulating resin layer formed on a bottom surface of the core, a top insulating resin layer formed on a top surface of the core, a wiring layer selectively formed on an outer surface of the bottom insulating resin layer or top insulating resin layer, and an electronic part contained in any of the holes. The top insulating resin layer is formed by a third insulating resin layer and a fourth insulating resin layer. The amount of a filler included in the fourth insulating resin layer is greater than that of the third insulating resin layer (the amount of a filler included in the third insulating resin layer may be zero as long as the layer has curing characteristics allowing the layer to be kept reliable). The fourth insulating resin layer fills the hole of the core such that the electronic part is surrounded by the resin. On a top surface of the fourth insulating layer, the third insulating resin layer which undergoes small plastic deformation is formed with a thickness that is sufficient to maintain insulation between the electronic part or a conductor on the core and the selectively disposed wiring layer.

In the second aspect of the invention, a structure is employed in which an insulating resin layer can be formed with two parts, i.e., an insulating resin layer which is first in an adhesive property to be used for reliably sealing an electronic part and which is solidified from that state and another insulating resin layer having no flowability for maintaining an insulation resistance. Thus, contradictory requirements at production steps can be satisfied. As a result of the partitioning to provide different functions, the fourth insulating resin layer including a greater amount of filler can be provided with a low linear expansion coefficient, which allows the implementation of a reliable configuration resistant to environmental changes. The third insulating resin layer including a smaller amount of filler can be provided with a thickness that is sufficient to maintain insulating properties, and high adhesion of the insulating resin layer to a wiring conductor formed thereon can be maintained. Thus, variation of the thickness of the top insulating resin layer can be suppressed, and the layer can therefore be provided with a small thickness which is preferable from the point of view of designing.

In a third aspect of the invention, there is provided an electronic part-incorporated multilayer substrate, including a core formed from a metal or an organic material and formed with a plurality of holes capable of containing an electronic part, a bottom insulating resin layer formed on a bottom surface of the core, a top insulating resin layer formed on a top surface of the core, a wiring layer selectively formed on an outer surface of the bottom insulating resin layer or top insulating resin layer, and an electronic part contained in any of the holes. The bottom insulating resin layer is formed by a first insulating resin layer and a second insulating resin layer. The second insulating resin layer is bonded to the bottom surface of the core. On a bottom surface of the second insulating resin layer, the first insulating resin layer which undergoes small plastic deformation is formed on a bottom surface of the second insulating resin layer. The first insulating resin layer has a thickness sufficient to maintain insulation between the electronic part or a conductor of the core and the selectively disposed wiring layer. At least a part of the bottom surface of the electronic part is bonded and secured to the second insulating resin layer in the hole. The top insulating resin layer is formed by a third insulating resin layer and a fourth insulating resin layer. The amount of a filler included in the fourth insulating resin layer is greater than that of the third insulating layer. The fourth insulating resin layer fills the hole of the core so as to surround the electronic part. On a top surface of the fourth insulating layer, the third insulating resin layer which undergoes small plastic deformation is formed with a thickness that is sufficient to maintain insulation between the electronic part and the wiring layer.

Obviously, in the third aspect of the invention, the same advantages as those of the first and second aspects of the invention are provided. In addition, the multi-layer substrate in this aspect of the invention employs a configuration that is a combination of an insulating resin layer which is solidified from an adhesive property during production and another insulating resin layer which is solidified during production from an adhesive property for allowing reliable sealing of an electronic part, there is no need for using an adhesive for securing an electronic part in a hole of the core. Therefore, the height of an electronic part contained in a hole can be controlled to be uniform as designed.

In a fourth aspect of the invention, there is provided an electronic part-incorporated multilayer substrate according to the first or third aspect of the invention, wherein the bottom insulating resin layer is provided by forming a first insulating resin layer for insulation having a predetermined thickness and undergoing small plastic deformation on a top surface of copper foil and forming an uncuring or half callousness thermosetting resin having a predetermined thickness to serve as a second insulating resin layer on a top surface of the first insulating resin layer.

In a fifth aspect of the invention, there is provided an electronic part-incorporated multilayer substrate, according to the second or third aspect of the invention, wherein the top insulating resin layer is provided by forming a third insulating resin layer for insulation having a constant thickness and undergoing small plastic deformation on a top surface of copper foil and forming an uncuring or half callousness thermosetting resin having a constant thickness to serve as a fourth insulating resin layer under a bottom surface of the third insulating resin layer.

In a sixth aspect of the invention, there is provided an electronic part-incorporated multilayer substrate, according to the first, third or fourth aspect the invention, wherein the thickness of the second insulating resin layer between the core and the first insulating resin layer is 10 µm or smaller (and, for example, not smaller than 0.1 µm).

In a seventh aspect of the invention, there is provided an electronic part-incorporated multilayer substrate, according to the second, third or fifth aspect of the invention, wherein the thickness of the fourth insulating resin layer between the core and the third insulating resin layer is 10 µm or smaller (and, for example, not smaller than 0.1 µm).

In an eighth aspect of the invention, there is provided a method of producing an electronic part-incorporated multilayer substrate, including:

a first step of providing a core formed with a plurality of holes for containing an electronic part and formed from a metal or an organic material;

a second step of providing a bottom insulating resin layer;

a third step of bonding a surface of the bottom insulating resin layer to a bottom surface of the core;

a fourth step of placing an electronic part in a hole of the core and securing the electronic part on the bottom insulating resin layer;

a fifth step of providing a top insulating resin layer; and a sixth step of filling the hole of the core with a part of the top insulating resin layer so as to surround the electronic part. The second step is a step of providing a bottom insulating resin layer including a first insulating resin layer which undergoes small plastic deformation and an uncuring or half callousness second insulating resin layer formed on the first insulating resin layer. The fourth step is a step of placing an electronic part in a hole, bonding at least a bottom surface of the electronic part to the second insulating resin layer by heating at least the second insulating resin layer, and thereafter securing the electronic part by heating the second insulating resin layer further to thermally cure the layer.

In the eighth aspect of the invention, an insulating resin in an uncuring or half callousness is employed, and the second insulating resin layer is heated and bonded to a bottom surface of the core at a third step. Thereafter, heating is performed at a fourth step to bond the electronic part to the second insulating resin layer while maintaining the uncuring or half callousness of the second insulating resin layer. An adhesive dispensing (supplying) operation can therefore be omitted, and there is no need for managing the height of the electronic part to achieve a uniform height by eliminating variation of the height which can occur when the electronic part is bonded and secured. Thus, a cost increase can be avoided.

In a ninth aspect of the invention, there is provided a method of producing an electronic part-incorporated multilayer substrate, including:

a first step of providing a core formed with a plurality of holes for containing an electronic part and formed from a metal or an organic material;

a second step of providing a bottom insulating resin layer;

a third step of bonding a surface of the bottom insulating resin layer to a bottom surface of the core;

a fourth step of placing an electronic part in a hole of the core and securing the electronic part on the bottom insulating resin layer;

a fifth step of providing a top insulating resin layer; and a sixth step of filling the hole of the core with a part of the top insulating resin layer so as to surround the electronic part. The fifth step is a step of providing a top insulating resin layer including a third insulating resin layer having a predetermined thickness and undergoing small plastic deformation and an uncuring or half callousness fourth insulating resin layer formed under the third insulating resin layer and including a filler in an amount greater than the amount of a filler included in the third insulating resin layer. The sixth step is a step of sealing the electronic part by filling the hole of the core with the fourth insulating resin layer so as to surround the electronic part while heating the fourth insulating resin layer to impart flowability to the same.

In the ninth aspect of the invention, the hole of the core is filled with the uncuring or half callousness fourth insulating resin layer such that the electronic part is surrounded by the resin after heating the resin to impart adhesive properties to be used for bonding. This process is carried out using only a simple step, i.e., heat vacuum press performed from below the third insulating resin layer undergoing small plastic deformation. The thickness of the top insulating resin layer can be kept sufficient to maintain an insulation resistance between the wiring layer selectively on the outer surface of the top insulation resin layer and the electronic part contained in the hole or a conductor on the core. It is possible to suppress variation of the thickness of the fourth insulating resin layer which is fluidized, and a need for control over the thickness can therefore be eliminated. Thus, a cost increase can be suppressed. The top insulating resin layer can be provided with a small thickness that is preferable from the point of view of designing.

In a tenth aspect of the invention, there is provided a method of producing an electronic part-incorporated multilayer substrate, including:

a first step of providing a core formed with a plurality of holes for containing an electronic part and formed from a metal or an organic material;

a second step of providing a bottom insulating resin layer;

a third step of bonding a surface of the bottom insulating resin layer to a bottom surface of the core;

a fourth step of placing an electronic part in a hole of the core and securing the electronic part on the bottom insulating resin layer;

a fifth step of providing a top insulating resin layer; and a sixth step of filling the hole of the core with a part of the top insulating resin layer so as to surround the electronic part. The second step is a step of providing a bottom insulating resin layer including a first insulating resin layer which undergoes small plastic deformation and an uncuring or half callousness second insulating resin layer formed on the first insulating resin layer. The fourth step is a step of placing the electronic part in the hole, bonding at least a bottom surface of the electronic part to the second insulating resin layer by heating at least the second insulating resin layer, and securing the electronic part by further heating the second insulating resin layer to cure it into a state having small plastic deformation. The fifth step is a step of providing a top insulating resin layer including a third insulating resin layer having a predetermined thickness and undergoing small plastic deformation and an uncuring or half callousness fourth insulating resin layer formed under the third insulating resin layer and including a filler in an amount greater than the amount of a filler included in the third insulating resin layer. The sixth step is a step of sealing the electronic part by filling the hole of the core with the fourth insulating resin layer such that the electronic part is surrounded by the resin while heating the fourth insulating resin layer to impart flowability to the same.

In the tenth aspect of the invention, the same advantages as provided by both the eighth and ninth aspects of the invention are provided. Since variation of the thicknesses of the top insulating resin layer and the bottom insulating resin layer can be suppressed, the thickness can be set as designed. Thus, the parts of the board above and under the core are dynamically balanced, and warping of the substrate can be suppressed. As a result the electronic part-incorporated multilayer substrate can be provided with a small thickness.

In an eleventh aspect of the invention, there is provided a method of producing an electronic part-incorporated multilayer substrate according to the eighth or tenth aspect of the invention, wherein the bottom insulating resin layer is provided by forming a first insulating resin layer for insulation having a predetermined thickness and undergoing small plastic deformation on a top surface of copper foil and forming an uncuring or half callousness thermosetting resin having a predetermined thickness to serve as a second insulating resin layer on a top surface of the first insulating resin layer.

In the eleventh aspect of the invention, the bottom insulating resin layer can be formed in a state in which the first insulating resin layer and the second insulating resin layer are integral with each other. Such a simplified step can be performed in a short time. The bonding between the core and the bottom insulating resin layer and between the bottom insulating resin layer and the electronic part can be carried out with the second insulating resin layer kept in the uncuring or half callousness. Since the electronic part can be secured without an adhesive, a contribution can be made to the suppression of a cost increase.

In a twelfth aspect of the invention, there is provided a method of producing an electronic part-incorporated multilayer substrate according to the tenth or eleventh aspect of the invention, wherein the top insulating resin layer is provided by forming a third insulating resin layer for insulation having a constant thickness and undergoing small plastic deformation under a bottom surface of copper foil and forming an uncuring or half callousness thermosetting resin having a constant thickness to serve as a fourth insulating resin layer under a bottom surface of the third insulating resin layer.

In the twelfth aspect of the invention, the top insulating resin layer can be formed in a state in which the third insulating resin layer and the fourth insulating resin layer are integral with each other. A heat vacuum press process can be used at such a simplified step, and the step can therefore be performed in a short time.

EFFECTS OF THE INVENTION

In at least some embodiments of the invention, it is possible to provide an electronic part-incorporated multilayer substrate and a method of producing the same, in which variation of the thickness of an insulating resin layer can be reduced to maintain insulating properties. Further, the linear expansion coefficient of the insulating resin layer can be reduced in a part thereof that fills a part accommodation part, and adhesive power between the insulating resin layer and a wiring conductor formed on the layer can be maintained.

In at least some of the aspects of the invention, it is possible to provide an electronic part-incorporated multilayer substrate and a method of producing the same, in which an operation of supplying an adhesive to each part accommodation part can be eliminated. It is also possible to suppress variation of the height of an electronic part contained in a part accommodation part attributable to variation in the amount of an adhesive supplied.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage of group of advantages as taught herein without necessarily achieving other objects or advantages as may be taught or suggested herein.

Further aspects, features and advantages of this invention will become apparent from the detailed description will follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are to scale.

Figure 1:
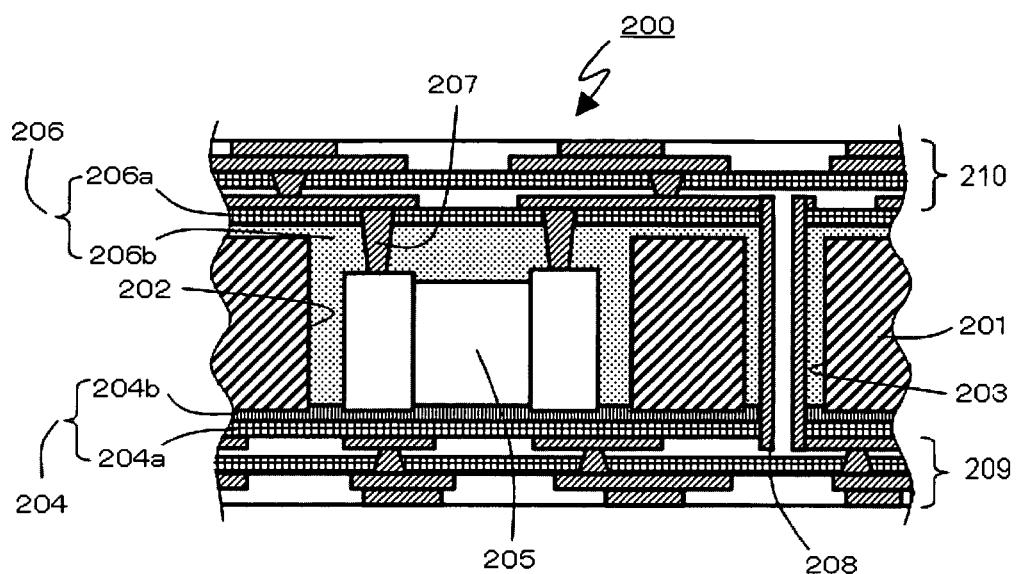
FIG. 1 is a schematic illustration showing a structure of an electronic part-incorporated multilayer substrate according to an embodiment of the invention.

EXPLANATION OF REFERENCES 200 multilayer substrate
201 core
202 hole
203 through hole
204 bottom insulating resin layer
204a first insulating resin layer
204b second insulating resin layer
205 electronic part
206 top insulating resin layer
206a third insulating resin layer
206b fourth insulating resin layer
207 vias
208 through hole
209 wiring layers
210 wiring layers
211 copper foil
212 copper foil
213 copper conductor layer
214 copper conductor layer

DETAILED DESCRIPTION OF THE PREFERRED EMBODIMENT

Embodiments of the invention will now be described with reference to the drawings.

The embodiments are not intended to limit the present invention. In the present disclosure where conditions and/or structures are not specified, the skilled artisan in the art can readily provide such conditions and/or structures, in view of the present disclosure, as a matter of routine experimentation.

FIG. 1 is an illustration showing a structure of an electronic part-incorporated multilayer substrate according to an embodiment of the invention. The embodiment described below is an electronic part-incorporated multilayer substrate and employing a core formed from a metal or an organic material. Referring to FIG. 1, a multi-layer substrate 200 includes a core 201 formed with a hole 202 in which an electronic part can be contained and a through hole 203 which is to serve to form a through hole 208. A bottom insulating resin layer 204 is formed on one side of the core, and a top insulating resin layer 206 is formed on another side of the core. An electronic part 205 such as a passive part or an active part is secured in the hole 202. A single or a multiplicity of wiring layers 210 and/or 209 is formed outside the top insulating resin layer 206 and/or the bottom insulating resin layer 204. The electronic part 205 is connected to an external circuit through vias 207.

The bottom insulating resin layer 204 has a multi-layer structure formed by a first insulating resin layer 204a and a second insulating resin layer 204b. The second insulating resin layer 204b is a layer which is in contact with the core 201, and the first insulating resin layer 204a is formed outside the second insulating resin layer 204b.

The top insulating resin layer 206 has a multi-layer structure formed by a third insulating resin layer 206a and a fourth insulating resin layer 206b. The fourth insulating resin layer 206b is a layer which is in contact with the core 201, and the third insulating resin layer 206a is formed outside the fourth insulating resin layer 206b.

The bottom insulating resin layer 204 has the function of insulating the electronic part 205 or the core 201 from the wiring layer 209. The layer 204 also has the function of bonding the wiring layer with the electronic part 205 or the core 201.

Specifically, the bottom insulating resin layer 204 of the present embodiment includes the first insulating resin layer 204a which has a certain thickness sufficient to maintain insulating properties required for the layer 204 to provide the insulating function and which undergoes small plastic deformation. The layer 204 also includes the second insulating resin layer 204b which provides the adhesive function and which has a thickness of 10 μm or less. The structure formed by two layers having different functions provides the following effects. An appropriate layer thickness required for interlaminar insulation is maintained by the first insulating resin layer 204a which undergoes small plastic deformation regardless of pressing conditions. Preferable bonding can be achieved by the second insulating resin layer 204b which is an uncuring or half callousness resin layer exhibiting adhesive properties when heated. It is desirable that the first insulating resin layer 204a is a resin layer having curing characteristics and having a resistance of $10^8 \Omega$ or more in the thickness direction and an elastic modulus of 1 GPa or more, e.g., a layer of thermoset epoxy resin having a thickness of about 20 to 50 μm. It is also desirable that the second insulating resin layer 204b used here is a resin in a state of half hardenability or B-stage state which has viscosity of 1500 Pa·sec or less when it is heated to bond the electronic part. Resins usable as the second insulating resin layer include thermosetting resins such as epoxy resins, polyimide resins, cyanate resins, thermosetting polyolefin resins, and thermosetting polyphenylene ether resins. A preferable material is a thermosetting epoxy resin including a spheroidal silica filler.

The top insulating resin layer 206 has the function of insulating the electronic part 205 or the core 201 from a wiring layer 210 and the function of sealing the electronic part 205, the sealing function being provided by filling the hole 202 with part of the layer 206. A resin material having a low linear expansion coefficient must be used for the part of the layer to fill the hole 202 in order to prevent the part from imparting heat stress to the electronic part 205 when it is soldered during assembly of the substrate or when there is a change in the ambient temperature. For this reason, a filler is included in the top insulating resin layer 206. However, adhesion between the top insulating resin layer 206 and a wiring conductor formed outside the layer tends to become weaker, the greater the amount of the filler included in the top insulating resin layer 206. Under the circumstance, the top insulating resin layer 206 is provided with a two-layer structure formed by the third insulating resin layer 206a which exhibits high adhesion to the wiring conductor and the fourth insulating resin layer 206b whose linear expansion coefficient is kept low. Thus, the top insulating resin layer 206 can satisfy both requirements, i.e., a low linear expansion coefficient and high adhesion to the wiring conductor. Preferably, the third insulating resin layer 206a is formed with a thickness of about 20 to 50 µm from the same resin as the above-described first insulating resin layer.

The amount of the filler included in the fourth insulating resin layer 206b must be greater than the amount of the filler included in the third insulating resin layer 206a in order to achieve well-balanced designing. That is, a relationship expressed by "the amount of the filler included in the third insulating resin layer<the amount of the filler included in the fourth insulating resin layer" must be kept true. For example, the amount of the filler included in the fourth insulating resin layer 206b is 50% or more by weight, and the amount is preferably in the range from 50 to 80% by weight. The amount of the filler included in the third insulating resin layer 206a is preferably 50% or less by weight. Those amounts depend on the type of the resin used. For example, a metal oxide such as silica, alumina, a magnesium oxide, a titanium oxide, or talc may be used as the filler. Other materials that can be used include aluminum hydroxides and magnesium hydroxides. The filler may have a spherical, fragmental, plate-like, whisker-shaped, or fibrous shape.

The base material of each of the above-described insulating resin layers may be a thermosetting resin such as an epoxy resin, a polyimide resin, a cyanate resin, a thermosetting polyolefin resin, or a thermosetting polyphenylene ether resin. Alternatively, a thermoplastic resin such as a liquid crystalline polymer, a polyetherketone resin, or a polyphenylene sulfide resin may be used.

As thus described, in the present embodiment, the thickness of the insulating resin layer can be appropriately maintained by the first insulating resin layer 204a which is hardly vulnerable to pressing conditions for obtaining a layer thickness required for insulation and to viscosity physical properties of a resin and which undergoes small plastic deformation. At the same time, preferable bonding can be achieved by the second insulating resin layer 204b serving as an adhesive layer. The third insulating resin layer 206a maintains high adhesion to the wiring conductor, and the fourth insulating resin layer 206b can prevent thermal stress from being exerted on the electronic part 205.

Further, when the bottom insulating resin layer 204 including the first insulating resin layer 204a and the second insulating resin layer 204b is laminated with the core 201, the resin constituting the second insulating resin layer 204b serving as an adhesive layer is kept in a B-stage state or in an uncuring or half callousness. Thus, the resin can be used as a resin for securing the electronic part 205, which eliminates a need for applying a liquid adhesive separately as described in Patent Document 1. Since there is no liquid resin which can be applied in an excessive amount, variation of the height of the electronic part 205 can be suppressed.

The fourth insulating resin layer 206b has curing characteristics including a linear expansion coefficient of 40 ppm/° C. or less and an elastic modulus of 1 GPa or more when the layer undergoes small plastic deformation. It is desirable that the layer has a filler content in the range from 50% to 80%, inclusive, by weight. The first insulating resin layer 204a and the third insulating resin layer 206a are to achieve the same function of adequately maintaining a layer thickness sufficient to provide insulating property. As long as the layers have curing characteristics which are sufficient for the layers to be reliable enough, the layers properly work regardless of whether they are formed from the same material or they are formed from different materials.

There is no particular limitation on the electronic part 205 to be incorporated, and the part may be either active part or passive part, or an integrated circuit part such as IC. In the case of an integrated circuit part, the part may be secured in either face-up fixation in which a surface of the part having terminals thereon faces upward or face-down fixation in which the terminal surface faces downward.

There is no particular limitation on the material of the core 201, and either metal or organic material may be used. When the core 201 is formed from a metal such as Cu, the core provides an improved effect of heat radiation when an IC consuming high power is incorporated and provides an improved effectiveness of electromagnetic interference shielding, so-called shielding effect when an IC having certain frequency characteristics is incorporated. When the core 201 is formed from an organic material, the core 201 itself can be used as a both-sided circuit board, and an electronic part-incorporated multilayer substrate can be provided with wirings disposed in a high density.

There is no need for providing conductors to achieve a shielding effect on the top and bottom surfaces of the core when a metal such as copper is used as the core. On the contrary, when an organic material is used as shown in FIG. 1, conductors may be provided on the core which serves as both a shielding layer and a wiring layer.

Usable organic materials include thermosetting resins such as epoxy resins, polyimide resins, cyanate resins, thermosetting polyolefin resins, and thermosetting polyphenylene ether resins. Alternatively, thermoplastic resins such as liquid crystalline polymers, polyetherketone resins, and polyphenylene sulfide resins may be used. Those resins may include glass cloth, alamide unwoven fabric, or an inorganic filler such as silica or alumina.

Figure 2:
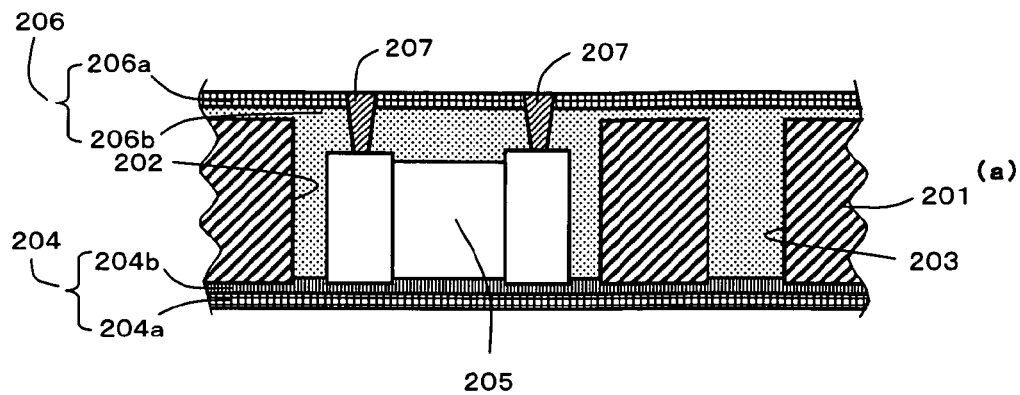
FIG. 2 is schematic illustrations showing examples of connections made to an electronic part.
Figure 2:
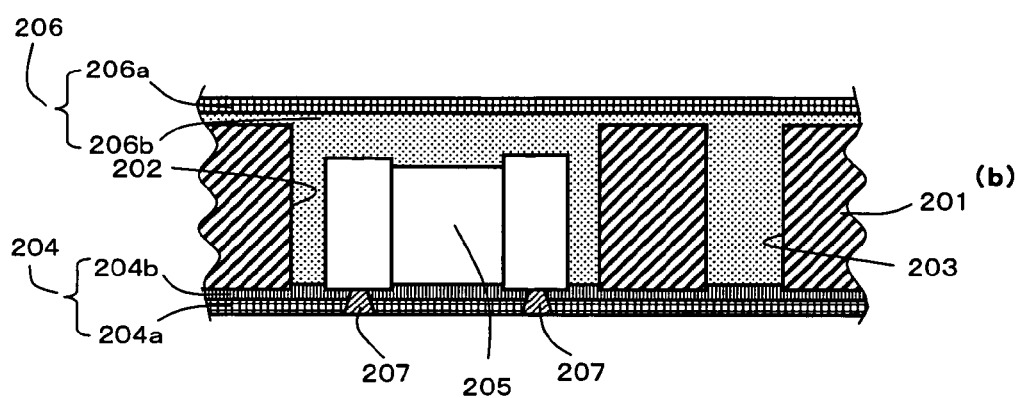
Figure 2:
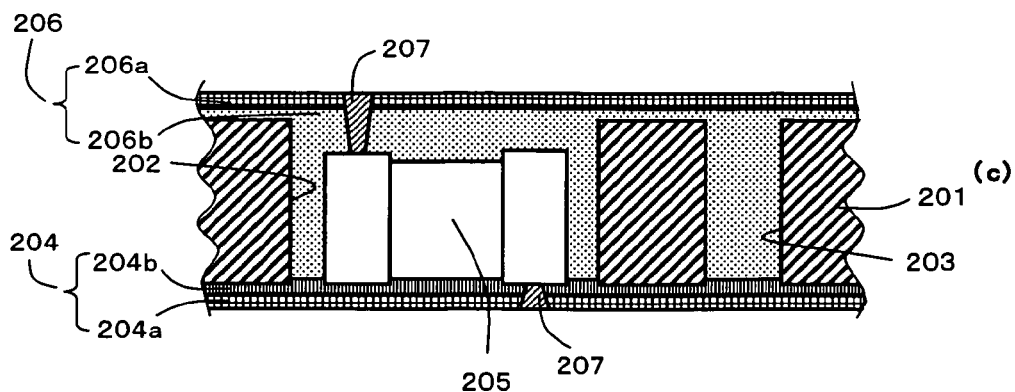

FIG. 2 is illustrations showing examples of connection of the electronic part. As shown in the figures, electrical connection between the wiring layer (not shown) formed on a surface of each of the bottom insulating resin layer 204 and the top insulating resin layer 206 and the electronic part 205 can be established by forming vias 207 typically using laser drilling and plating. A connection using vias 207 may be made from either the bottom insulating resin layer 204 or the top insulating resin layer 206. FIG. 2A shows an example of a connection made from the top insulating resin layer 206. FIG. 2B shows an example of a connection made from the bottom insulating resin layer 204. FIG. 2C shows an example of connections made from both of the layers.

Figure 3:
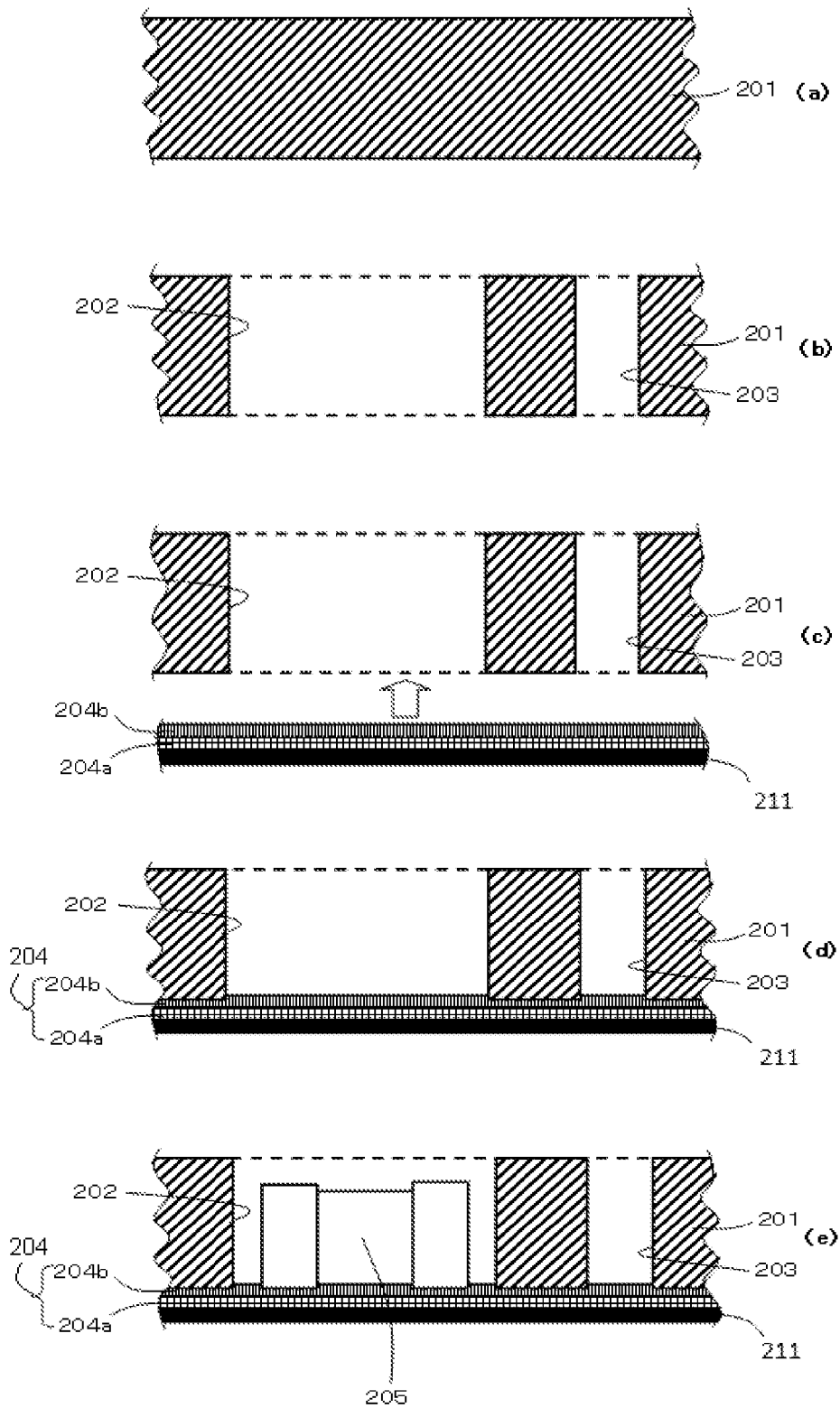
FIG. 3 is schematic illustrations showing steps for producing the electronic part-incorporated multilayer substrate according to the embodiment of the invention.

Steps for producing an electronic part-incorporated multilayer substrate according to the present embodiment will now be described by referring to a multi-layer substrate 200 as shown in FIG. 1 by way of example. First, as shown in FIG. 3A, a core 201 made of an organic material is provided. Next, as shown in FIG. 3B, a hole forming process such as etching is performed on the core 201 in a position where an electronic part is to be incorporated and in a position where a through hole is to be formed. The regions subjected to the hole forming process become a hole 202 to serve as a part accommodation part and a through hole 203, respectively. Next, as shown in FIGS. 3C and 3D, a film-like bottom insulating resin layer 204 is provided. The layer includes a first insulating resin layer 204a undergoing small plastic deformation and a second insulating resin layer 204b in an uncuring or half callousness having relatively high adhesive and sealing properties laminated on a top surface of copper foil 211. Thereafter, the second insulating resin layer 204b in an uncuring or halfcallousness is solized (fluidized) by heating it to a temperature in the range from 40 to 60° C., the temperature depending on the resin used. Thus, the layer is bonded to a bottom surface of the core 201. When the second insulating resin layer 204b is thus applied, the layer is temporarily returned to the room temperature to keep it in the uncuring or half callousness instead of curing it completely or putting it in a state undergoing small plastic deformation.

Next, as shown in FIG. 3E, an electronic part 205 is mounted in the hole 202. Specifically, the second insulating resin layer 204b in the uncuring or half callousness is fluidized by heating it again to a temperature in the range from 40 to 60° C. with the electronic part 205 mounted on the second insulation resin layer 204b in the hole 202. Thus, the layer 204b is therefore provided with adhesive properties required for the mounting. Thereafter, the second insulating resin layer 204b is completely cured by heating it to a temperature in the range from 150 to 180° C., the temperature depending on the type of the resin used. Thus, the electronic part 205 is secured. When the electronic part 205 is secured, the second insulating resin layer 204b preferably has viscosity of 1500 Pa·sec or less.

After the electronic part 205 is mounted in the hole 202 as shown in FIG. 3E, exposed surfaces are roughened to improve sticking of a resin to the surfaces in preparation for the next step.

Figure 4:
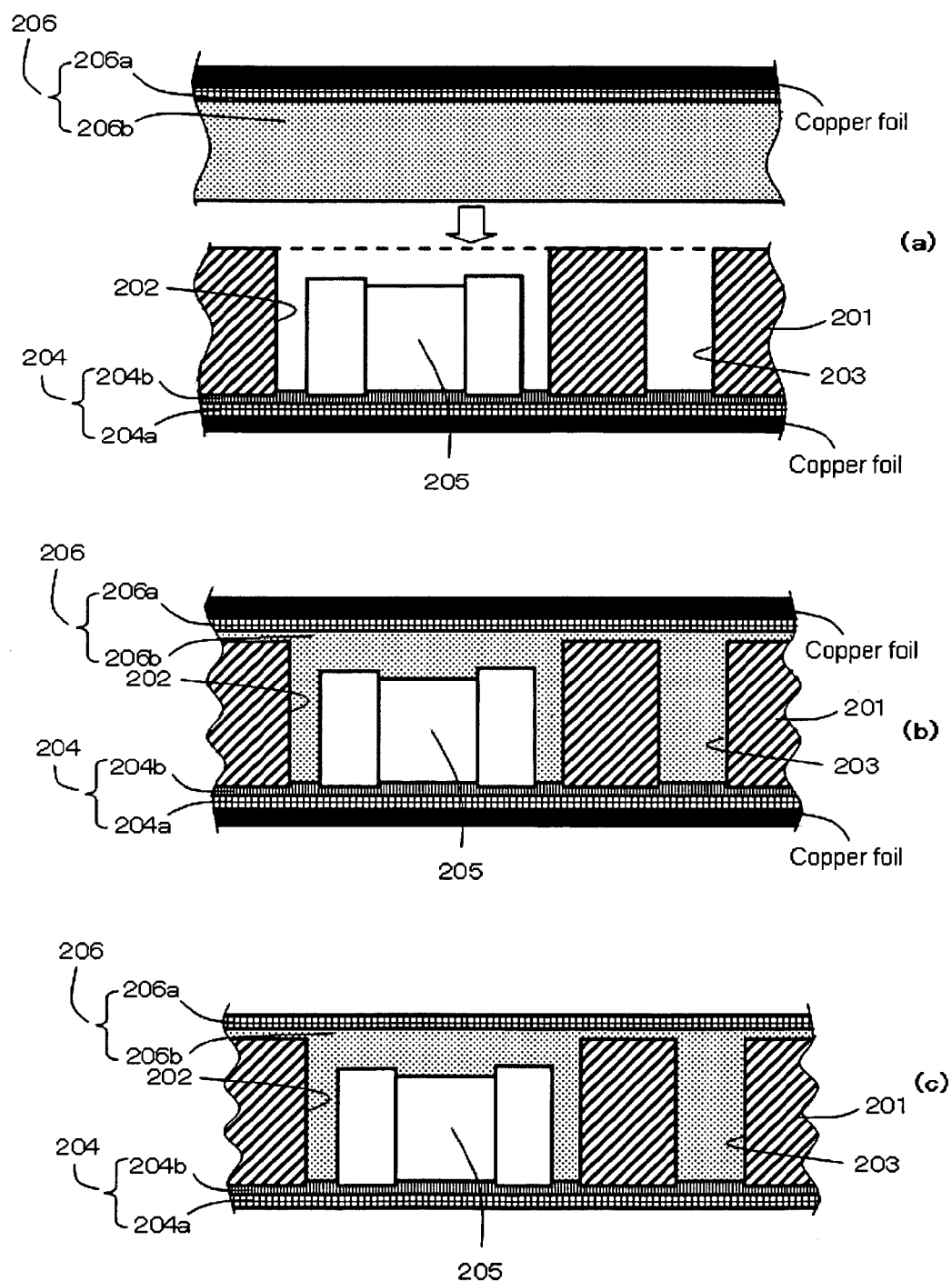
FIG. 4 is schematic illustrations showing steps for producing the electronic part-incorporated multilayer substrate according to the embodiment of the invention.

Next, as shown in FIG. 4A, a top insulating resin layer 206 is created or prepared in the form of a film by laminating a third insulating resin layer 206a which undergoes small plastic deformation under copper foil 212 and laminating a fourth insulating resin layer 206b in an uncuring or half callousness under the third insulating resin layer 206a, the layer 206b having a filler content greater than that of the third insulating resin layer 206a, e.g., a filler content in the range from 50 to 80% by weight depending on the type of the resin used. The top insulating resin layer 206 is disposed above a top surface of the core 201. As shown in FIG. 4B, the fourth insulating resin layer 206b in an uncuring or half callousness is fluidized and pressed to fill the hole 202 and the through hole 203 with the fourth insulating resin layer 206b such that the electronic part 205 is surrounded by the resin while heating the layer 206b to a temperature in the range from 150 to 180° C., the temperature depending on the type of the resin used. Such a heating process may be performed according to a two-step method. Specifically, the fourth insulating resin layer may be first heated to a temperature in the range from about 40° C. to about 150° C. at which the layer has adhesive properties, and the layer may be pressed into the hole 202 and a through hole 208 at the temperature. Then, the fourth insulating resin layer 206b may be completely cured by heating it to a temperature in the range from 150 to 180° C. The temperatures mentioned above depend on the type of the resin that is used. The use of heat vacuum press will simplify operations performed at the step of heating and fluidizing the fourth insulating resin layer 206b and the step of continuing the heating to cure the layer completely. Subsequently, each copper foil 211/212 is etched away as shown in FIG. 4C. Thus, the electronic part 205 is sealed with the fourth insulating resin layer 206b.

Figure 5:
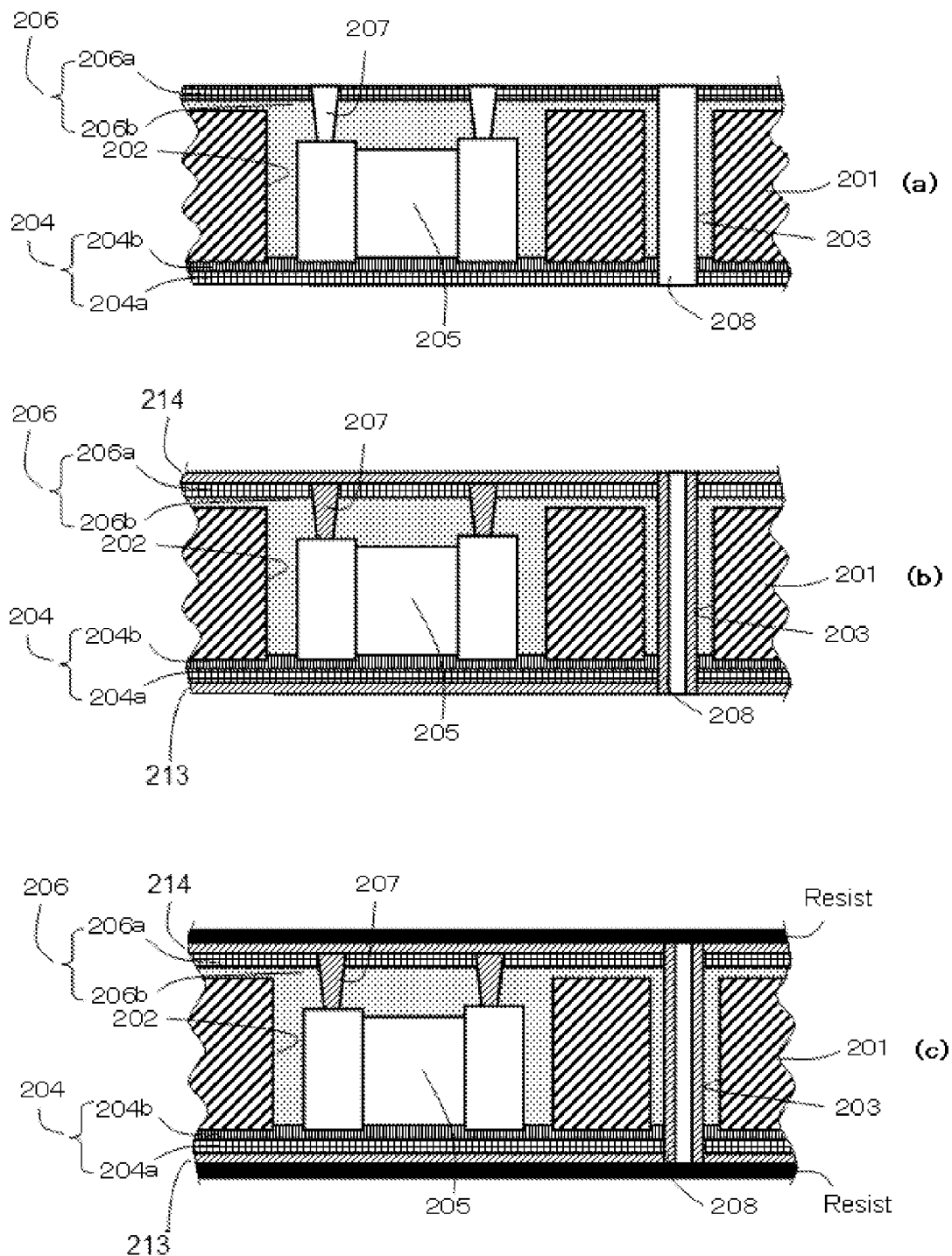
FIG. 5 is schematic illustrations showing steps for producing the electronic part-incorporated multilayer substrate according to the embodiment of the invention.

Next, as shown in FIG. 5A, laser processing is performed to form via holes to be used for vias 207 for forming conductors to connect the electronic part 205 and wiring conductors and to form a through hole 208 for forming a conductor to connect a wiring layer on the top surface and a wiring layer on the bottom surface. After cleaning up resin particles generated when the holes are formed, substrate is carried out, and copper is deposited using electroless deposition to form seed layers throughout the surfaces including the interior of the via holes and the through hole 208, as shown in FIG. 5B. Thereafter, electrolysis copper plating is carried out to form vias 207 and through hole conductors. At the same time, Cu conductor layers 213, 214 are formed under the bottom insulating resin layer 204 and on the top insulating resin layer 206, respectively. Next, as shown in FIG. 5C, a resist is formed on the conductor layers formed at the above-described step. The etching resist may be either positive photo-resist which is dissolved in a part thereof exposed to light or negative photo-resist which is cured in a part thereof exposed to light.

Figure 6:
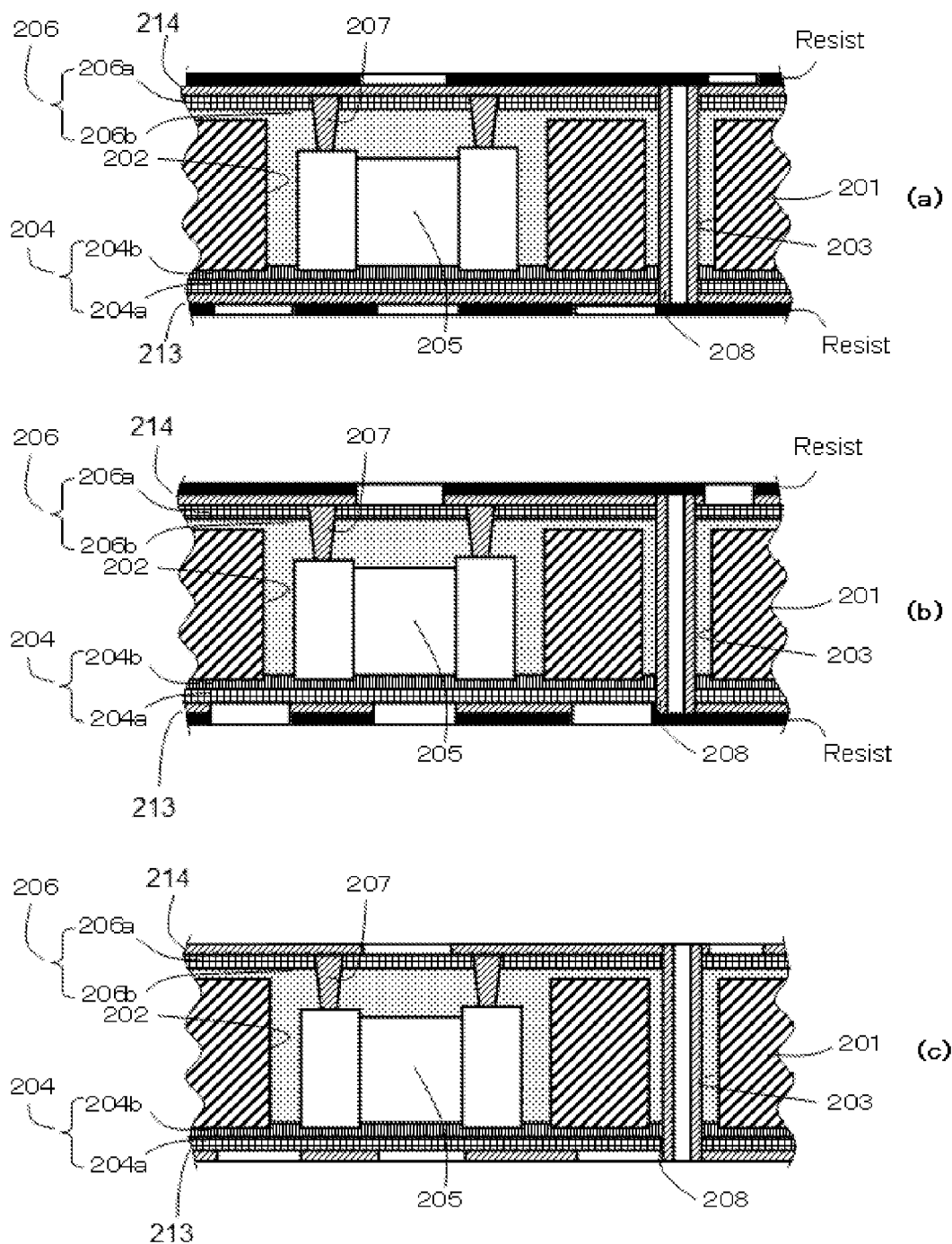
FIG. 6 is schematic illustrations showing steps for producing the electronic part-incorporated multilayer substrate according to the embodiment of the invention.
Figure 7:
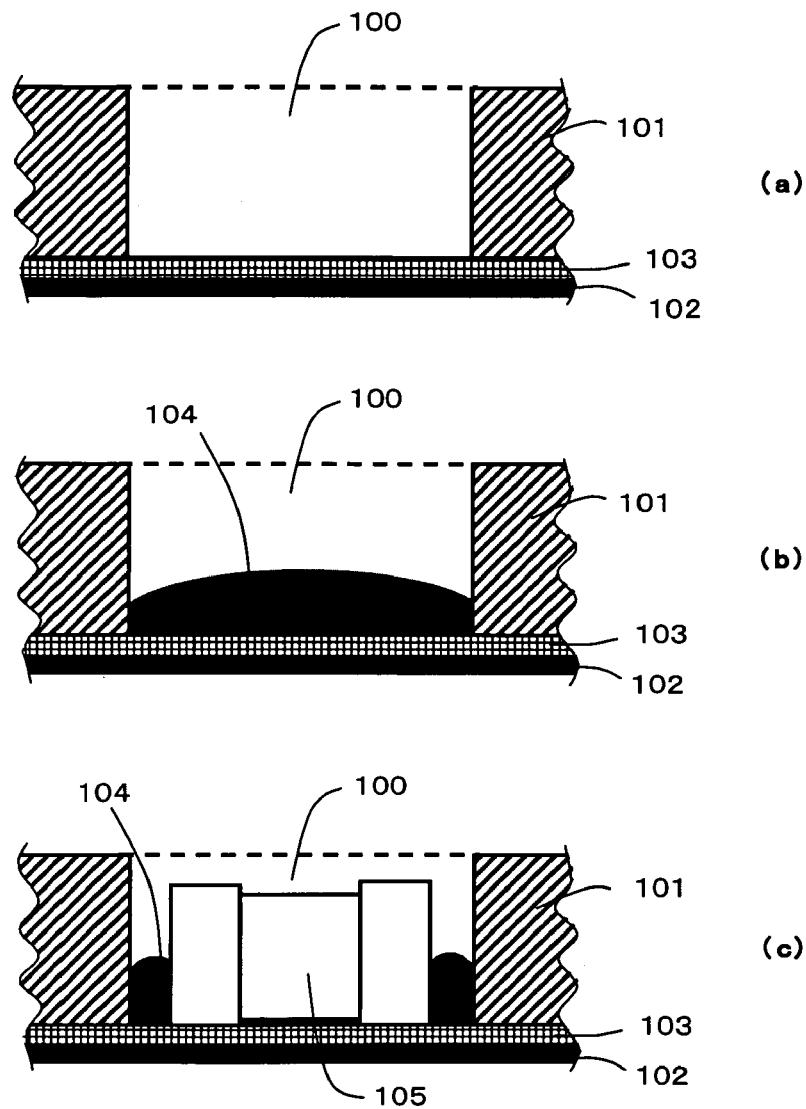
FIG. 7 is schematic illustrations showing steps for producing an electronic part-incorporated multilayer substrate according to the related art.
Figure 8:
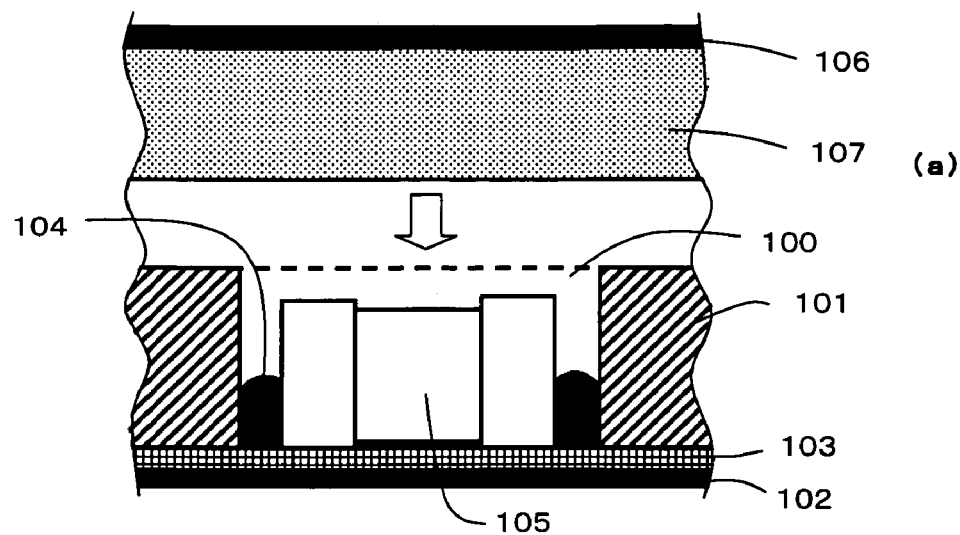
FIG. 8 is schematic illustrations showing steps for producing the electronic part-incorporated multilayer substrate according to the related art.
Figure 8:
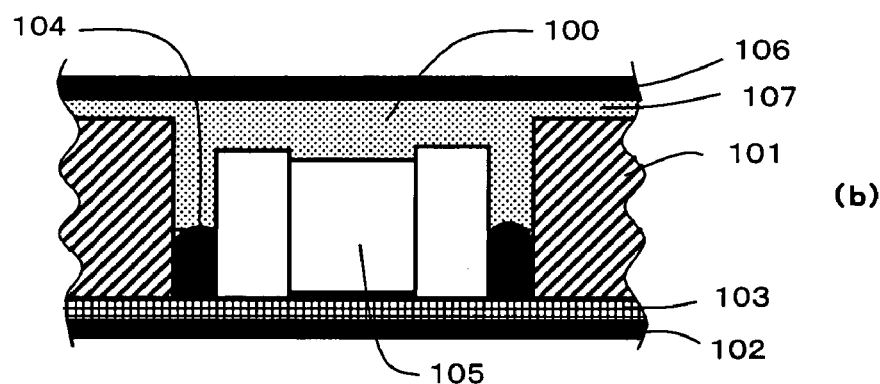

Next, as shown in FIG. 6A, the resist is exposed to light and developed to expose the Cu conductor layers 213, 214 to be etched away. Next, as shown in FIG. 6B, the exposed Cu conductors are etched away. Next, the resist is removed as shown in FIG. 6C to obtain an electronic part-incorporated multilayer substrate, which has wiring conductors formed on a bottom insulating resin layer 204 and a top insulating resin layer 206.

Thereafter, wiring layers 209/210 are formed using existing multi-layer processes for forming buildup multilayer interconnection substrate and the like. An electronic part-incorporated multilayer substrate 200 as shown in FIG. 1 is provided through the above-described processes.

The invention is not limited to the above description, and various modifications may be made without departing from the gist of the invention.

1) The above description of the embodiment of the invention discloses only a production method in which a wiring layer is formed in a single-layer structure. Alternatively, another wiring layer may be formed on the copper foil on which the bottom insulating resin layer or the top insulating resin layer is formed. Specifically, the wiring layer is formed using a film having an insulating resin layer undergoing small plastic deformation and another insulating resin layer which becomes adhesive when heated and which finally enters a state having small plastic deformation when further heated. Thereafter, a layer is formed on an outer surface of the wiring layer using heat vacuum press, and the copper foil is etched away to form an insulation layer, Then, via holes are provided using a laser, and resin particles are eliminated. Thereafter, a series of plating processes is performed to complete the wiring layer. Such steps may be repeated to build up a required number of wiring layers.

2) According to the method disclosed in the description of the embodiment, a wiring layer is formed by performing electroless copper plating and electrolysis copper plating throughout a surface and forming a pattern using an etching resist (subtractive method). Alternatively, a wiring layer may be provided using a method in which a resist pattern is formed using a plating resist after performing electroless copper plating; electrolysis copper plating is performed thereafter; and the resist and the layer formed by electroless copper plating are removed to form a pattern (semi-additive method).

The present invention includes the above-mentioned embodiment and other various embodiments including the following.

1) An electronic part-incorporated multilayer substrate including a core formed from a metal or an organic material and formed with a plurality of holes capable of containing an electronic part, a bottom insulating resin layer formed on a bottom surface of the core, a top insulating resin layer formed on a top surface of the core, a wiring layer selectively formed on an outer surface of the bottom insulating resin layer or top insulating resin layer, and an electronic part contained in any of the holes, said electronic part-incorporated multilayer substrate being characterized in that the bottom insulating resin layer is formed by a first insulating resin layer and a second insulating resin layer;

the second insulating resin layer is bonded to the bottom surface of the core, and the first insulating resin layer which undergoes small plastic deformation is formed on a bottom surface of the second insulating resin layer and the first insulating resin layer has a thickness sufficient to maintain insulation between the electronic part or a conductor of the core and the selectively disposed wiring layer; and at least a part of a bottom surface of the electronic part is bonded and secured to the second insulating resin layer in the hole.

2) An electronic part-incorporated multilayer substrate comprising a core formed from a metal or an organic material and formed with a plurality of holes capable of containing an electronic part; a bottom insulating resin layer formed on a bottom surface of the core; a top insulating resin layer formed on a top surface of the core; a wiring layer selectively formed on an outer surface of the bottom insulating resin layer or top insulating resin layer; and an electronic part contained in any of the holes, said electronic part-incorporated multilayer substrate being characterized in that the top insulating resin layer is formed by a third insulating resin layer and a fourth insulating resin layer;

the fourth insulating resin layer includes a filler in an amount greater than that in the third insulating resin layer and fills the hole of the core such that the electronic part is surrounded and sealed by the resin; and on a top surface of the fourth insulating resin layer, the third insulating resin layer which undergoes small plastic deformation is formed with a thickness that is sufficient to maintain insulation between the electronic part or a conductor of the core and the selectively disposed wiring layer.

3) An electronic part-incorporated multilayer substrate comprising a core formed from a metal or an organic material and formed with a plurality of holes capable of containing an electronic part; a bottom insulating resin layer formed on a bottom surface of the core; a top insulating resin layer formed on a top surface of the core; a wiring layer selectively formed on an outer surface of the bottom insulating resin layer or top insulating resin layer, and an electronic part contained in any of the holes, said electronic part-incorporated multilayer substrate being characterized in that the bottom insulating resin layer is formed by a first insulating resin layer and a second insulating resin layer;

the second insulating resin layer is bonded to the bottom surface of the core, and on a bottom surface of the second insulating resin layer, the first insulating resin layer which undergoes small plastic deformation is formed with a thickness sufficient to maintain insulation between the electronic part or a conductor of the core and the selectively disposed wiring layer;

at least a part of a bottom surface of electronic part is bonded and secured to the second insulating resin layer in the hole;

the top insulating resin layer is formed by a third insulating resin layer and a fourth insulating resin layer;

the fourth insulating resin layer includes a filler in an amount greater than that in the third insulating resin layer and fills the hole of the core such that the electronic part is surrounded and sealed by the resin; and on a top surface of the fourth insulating layer, the third insulating resin layer which undergoes small plastic deformation is formed with a thickness that is sufficient to maintain insulation between the electronic part and the wiring layer.

4) An electronic part-incorporated multilayer substrate according to above 1) or 3), characterized in that the bottom insulating resin layer is provided by forming a first insulating resin layer for insulation having a predetermined thickness and undergoing small plastic deformation on a top surface of copper foil and forming an uncuring or half callousness thermosetting resin having a predetermined thickness to serve as a second insulating resin layer on a top surface of the first insulating resin layer.

5) An electronic part-incorporated multilayer substrate according to above 2) or 3), wherein the top insulating resin layer is provided by forming a third insulating resin layer for insulation having a constant thickness and undergoing small plastic deformation under a bottom surface of copper foil and forming an uncuring or half callousness thermosetting resin having a constant thickness to serve as a fourth insulating resin layer on a top surface of the third insulating resin layer.

6) An electronic part-incorporated multilayer substrate according to above 1), 3), or 4), characterized in that the thickness of the second insulating resin layer between the core and the first insulating resin layer is 10 μm or smaller.

7) An electronic part-incorporated multilayer substrate according to above 2), 3) or 5), characterized in that the thickness of the fourth insulating resin layer between the core and the third insulating resin layer is 10 μm or smaller.

8) A method of producing an electronic part-incorporated multilayer substrate includes:

a first step of providing a core formed with a plurality of holes for containing an electronic part and formed from a metal or an organic material;

a second step of providing a bottom insulating resin layer;

a third step of bonding a surface of the bottom insulating resin layer to a bottom surface of the core;

a fourth step of placing an electronic part in a hole of the core and securing the electronic part on the bottom insulating resin layer;

a fifth step of providing a top insulating resin layer; and a sixth step of filling the hole of the core with a part of the top insulating resin layer such that the electronic part is surrounded by the resin.

The second step is a step of providing a bottom insulating resin layer including a first insulating resin layer which undergoes small plastic deformation and an uncuring or half callousness second insulating resin layer formed on the first insulating resin layer.

The fourth step is a step of placing the electronic part, bonding at least a bottom surface of the electronic part to the second insulating resin layer by heating at least the second insulating resin layer, and thereafter securing the electronic part by heating the second insulating resin layer further to cure it into a state having small plastic deformation.

9) A method of producing an electronic part-incorporated multilayer substrate includes:

a first step of providing a core formed with a plurality of holes for containing an electronic part and formed from a metal or an organic material;

a second step of providing a bottom insulating resin layer;

a third step of bonding a surface of the bottom insulating resin layer to a bottom surface of the core;

a fourth step of placing an electronic part in a hole of the core and securing the electronic part on the bottom insulating resin layer;

a fifth step of providing a top insulating resin layer; and a sixth step of filling the hole of the core with a part of the top insulating resin layer such that the electronic part is surrounded by the resin.

The fifth step is a step of providing a top insulating resin layer including a third insulating resin layer having a predetermined thickness and undergoing small plastic deformation and an uncuring or half callousness fourth insulating resin layer formed under the third insulating resin layer and including a filler in an amount greater than the amount of a filler included in the third insulating resin layer; and the sixth step is a step of sealing the electronic part by filling the hole of the core with the fourth insulating resin layer such that the electronic part is surrounded by the resin while heating the fourth insulating resin layer to impart flowability to the same.

10) A method of producing an electronic part-incorporated multilayer substrate includes:

a first step of providing a core formed with a plurality of holes for containing an electronic part and formed from a metal or an organic material;

a second step of providing a bottom insulating resin layer;

a third step of bonding a surface of the bottom insulating resin layer to a bottom surface of the core;

a fourth step of placing an electronic part in a hole of the core and securing the electronic part on the bottom insulating resin layer;

a fifth step of providing a top insulating resin layer; and a sixth step of filling the hole of the core with a part of the top insulating resin layer such that the electronic part is surrounded by the resin.

The second step is a step of providing a bottom insulating resin layer including a first insulating resin layer which undergoes small plastic deformation and an uncuring or half callousness second insulating resin layer formed on the first insulating resin layer.

The fourth step is a step of placing the electronic part, bonding at least a bottom surface of the electronic part to the second insulating resin layer by heating at least the second insulating resin layer, and securing the electronic part by further heating the second insulating resin layer to cure it into a state having small plastic deformation.

The fifth step is a step of providing a top insulating resin layer including a third insulating resin layer having a predetermined thickness and undergoing small plastic deformation and an uncuring or halfcallousness fourth insulating resin layer formed under the third insulating resin layer and including a filler in an amount greater than the amount of a filler included in the third insulating resin layer.

The sixth step is a step of sealing the electronic part by filling the hole of the core with the fourth insulating resin layer such that the electronic part is surrounded by the resin while heating the fourth insulating resin layer to impart flowalibity to the same.

11) A method of producing an electronic part-incorporated multilayer substrate according to the above 8) or 10), wherein the bottom insulating resin layer is provided by forming a first insulating resin layer for insulation having a predetermined thickness and undergoing small plastic deformation on a top surface of copper foil and forming an uncuring or half callousness thermosetting resin having a predetermined thickness to serve as a second insulating resin layer on a top surface of the first insulating resin layer.

12) A method of producing an electronic part-incorporated multilayer substrate according to the above 9), or 10), wherein the top insulating resin layer is provided by forming a third insulating resin layer for insulation having a constant thickness and undergoing small plastic deformation under a bottom surface of copper foil and forming an uncuring or half callousness thermosetting resin having a constant thickness to serve as a fourth insulating resin layer on under a bottom surface of the third insulating resin layer.

The present application claims priority to Japanese Patent Application No. 2007-229920, filed Sep. 5, 2007, and No. 2008-214021, filed Aug. 22, 2008, the disclosure of each of which is incorporated herein by reference in its entity.

It will be understood by those skilled in the art that numerous and various modifications can be made without departing from the spirit of the present invention. Therefore, it should be clearly understood that the forms of the present invention are illustrative only and are not intended to limit the scope of the present invention.

What is claimed is:

1. An electronic part-incorporated multilayer substrate, comprising:

a core formed from a metal or an organic material and formed with at least one hole capable of containing an electronic part;

a bottom insulating resin layer formed on a bottom surface of the core;

a top insulating resin layer formed on a top surface of the core;

a wiring layer formed on a bottom surface of the bottom insulating resin layer and another wiring layer formed on a top surface of the top insulating resin layer; and the electronic part contained in the at least one hole, wherein the bottom insulating resin layer is formed by a first insulating resin layer and a second insulating resin layer;

the second insulating resin layer is bonded to the bottom surface of the core, and the first insulating resin layer is formed on a bottom surface of the second insulating resin layer, the first insulating resin layer having a thickness such that insulation is maintained between the electronic part and the wiring layer and between the core and the wiring layer;

the electronic part is mounted on a top surface of the second insulating resin layer, and at least a part of a bottom surface of the electronic part is bonded and secured to the top surface of the second insulating resin layer, by adhesion of the top surface of the second insulating resin layer, in the at least one hole, said at least one hole being filled with a resin which constitutes the top insulating resin layer and which contains a filler;

the top insulating resin layer is formed by a third insulating resin layer and a fourth insulating resin layer;

the fourth insulating resin layer includes the filler in an amount greater than that in the third insulating resin layer, the fourth insulation resin layer fills the at least one hole of the core such that the electronic part is surrounded and sealed by the resin; and the third insulating resin layer which has a thickness such that insulation is maintained between the another wiring layer and the electronic part, and the third insulating resin layer is formed on a top surface of the fourth insulating resin layer.

2. An electronic part-incorporated multilayer substrate according to claim 1, wherein the bottom insulating resin layer is provided by forming the first insulating resin layer for insulation having a predetermined thickness on a top surface of copper foil and forming an uncured or half cured thermosetting resin having a predetermined thickness to serve as the second insulating resin layer on a top surface of the first insulating resin layer, said copper foil being removed after the electronic part is bonded to the bottom insulating resin layer.

3. An electronic part-incorporated multilayer substrate according to claim 1, wherein the top insulating resin layer is provided by forming the third insulating resin layer for insulation having a constant thickness under a bottom surface of copper foil and forming an uncured or half cured thermosetting resin having a constant thickness to serve as the fourth insulating resin layer under a bottom surface of the third insulating resin layer, and placing the top insulating resin layer upside down on the electronic part and the core to fill the at least one hole therewith, said copper foil being removed thereafter.

4. An electronic part-incorporated multilayer substrate according to claim 1, wherein a thickness of the second insulating resin layer between the core and the first insulating resin layer is 10 μm or smaller.

5. An electronic part-incorporated multilayer substrate according to claim 1, wherein a thickness of the fourth insulating resin layer between the core and the third insulating resin layer is 10 μm or smaller.

6. An electronic part-incorporated multilayer substrate according to claim 1, wherein the fourth insulating resin layer contains the filler in an amount of 50% or more by weight, whereas the third insulating resin layer contains the filler in an amount of 50% or less by weight.

7. A method of producing an electronic part-incorporated multilayer substrate of claim 1, comprising:
   a first step of providing a core formed with at least one hole for containing an electronic part and formed from a metal or an organic material;
   a second step of providing a bottom insulating resin layer, the bottom insulating resin layer including a first insulating resin layer and an uncured or half cured second insulating resin layer formed on the first insulating resin layer;
   a third step of bonding a surface of the bottom insulating resin layer to a bottom surface of the core;
   a fourth step of placing the electronic part in the at least one hole of the core, bonding at least a bottom surface of the electronic part to the second insulating resin layer by heating at least the second insulating resin layer, and thereafter securing the electronic part on the bottom insulating resin layer by heating the second insulating resin layer further to thermally cure the second insulating resin layer, wherein plastic deformation is caused to a top surface of the bottom insulating resin layer;
   a fifth step of providing a top insulating resin layer, the to insulating resin layer including a third insulating resin layer having a predetermined thickness and an uncured or half cured fourth insulating resin layer formed under the third insulating resin layer, the fourth insulation resin layer including a filler in an amount greater than an amount of a filler included in the third insulating resin layer;
   a sixth step of sealing the electronic part by filling the at least one hole of the core with the fourth insulating resin of the top insulating resin layer such that the electronic part is surrounded by a resin while heating the fourth insulating resin layer to impart flowability to the fourth insulating resin layer, a part of the to insulating resin layer being the fourth insulating resin;
   a seventh step of forming a wiring layer on a bottom surface of the bottom insulating resin layer; and
   an eighth step of forming another wiring layer on a top surface of the top insulating resin layer.

8. A method according to claim 7, wherein the bottom insulating resin layer is provided by forming the first insulating resin layer for insulation having a predetermined thickness on a top surface of copper foil and forming an uncured or half cured thermosetting resin having a predetermined thickness to serve as the second insulating resin layer formed on a top surface of the first insulating resin layer.

* * * * *

UNITED STATES PATENT AND TRADEMARK OFFICE
CERTIFICATE OF CORRECTION

PATENT NO. : 8,314,343 B2
APPLICATION NO. : 12/200920
DATED : November 20, 2012
INVENTOR(S) : Yusuke Inoue et al.

It is certified that error appears in the above-identified patent and that said Letters Patent is hereby corrected as shown below:

Please delete "upside down" in column (19), line 9 (claim 3), which was deleted in the amendment of 01/20/2012.
Please delete "the to" in column (20), line 10 (claim 7), and insert therefor --the top--.
Please delete "the to" in column (20), line 23 (claim 7), and insert therefor --the top--.

Signed and Sealed this
Twelfth Day of February, 2013

Teresa Stanek Rea
*Acting Director of the United States Patent and Trademark Office*